(12) United States Patent
Adam et al.

(10) Patent No.: US 9,154,107 B2
(45) Date of Patent: Oct. 6, 2015

(54) LATERAL OVER-MODED BULK ACOUSTIC RESONATORS

(75) Inventors: John D. Adam, Millersville, MD (US);
Silai V. Krishnaswamy, Monroeville, PA (US); Gianluca Piazza, Philadelphia, PA (US)

(73) Assignees: Northrop Grumman Systems Corporation, Falls Church, VA (US); The Trustees of the University of Pennsylvania, Philadelphia, PA (US)

( * ) Notice: Subject to any disclaimer, the term of this patent is extended or adjusted under 35 U.S.C. 154(b) by 768 days.

(21) Appl. No.: 13/321,075

(22) PCT Filed: May 28, 2010

(86) PCT No.: PCT/US2010/036614
§ 371 (c)(1),
(2), (4) Date: Nov. 17, 2011

(87) PCT Pub. No.: WO2010/138838
PCT Pub. Date: Dec. 2, 2010

(65) Prior Publication Data
US 2012/0081195 A1 Apr. 5, 2012

Related U.S. Application Data

(60) Provisional application No. 61/182,065, filed on May 28, 2009.

(51) Int. Cl.
*H03H 9/70* (2006.01)
*H03H 9/54* (2006.01)
(Continued)

(52) U.S. Cl.
CPC ....... *H03H 9/02078* (2013.01); *H03H 9/02228* (2013.01); *H03H 9/172* (2013.01);
(Continued)

(58) Field of Classification Search
CPC ... H03H 2003/0071; H03H 3/02; H03H 3/08; H03H 3/10; H03H 9/0004; H03H 9/0095; H03H 9/02007; H03H 9/02047; H03H 9/02055; H03H 9/02086; H03H 9/02448; H03H 9/02433; H03H 9/703
USPC ........................................................ 333/133
See application file for complete search history.

(56) References Cited

U.S. PATENT DOCUMENTS 4,774,483 A * 9/1988 Miccoli et al. ................ 333/219
5,185,589 A * 2/1993 Krishnaswamy et al. ..... 333/133
(Continued)

OTHER PUBLICATIONS

International Search Report for corresponding EP 10 78 1289, completed May 23, 2014 by B-M Radomirescu of The Hague.
(Continued)

*Primary Examiner* — Stephen E Jones
*Assistant Examiner* — Scott S Outten
(74) *Attorney, Agent, or Firm* — Tarolli, Sundheim, Covell & Tummino LLP (57) ABSTRACT

A bulk acoustic resonator assembly and methods for fabricated the resonator assembly is provided. The resonator includes a cavity on a first surface of a substrate, with a sheet of low acoustic loss material suspended over the cavity. The sheet of low acoustic loss material is configured such that an associated fundamental frequency of the sheet of low acoustic loss material is a function of a length of the sheet of low acoustic loss material in a direction parallel to the first surface of the substrate. A transducer includes an electromechanical layer on the sheet of low acoustic loss material and a patterned conductive material formed on the electromechanical material. The transducer is configured to induce vibrations in the low acoustic loss material upon application of an electrical signal to the conductive pattern.

15 Claims, 4 Drawing Sheets

(51) Int. Cl.
*H03H 9/58* (2006.01)
*H03H 9/02* (2006.01)
*H03H 9/17* (2006.01)
H03H 3/02 (2006.01)
H03H 9/24 (2006.01)
H03H 9/15 (2006.01)

(52) U.S. Cl.
CPC ............... *H03H2003/023* (2013.01); *H03H 2009/02488* (2013.01); *H03H 2009/155* (2013.01); *H03H 2009/241* (2013.01); *Y10T 29/42* (2015.01)

(56) References Cited

U.S. PATENT DOCUMENTS

| | | | |
|---|---|---|---|
| 5,233,259 | A | 8/1993 | Krishnaswamy et al. |
| 5,801,603 | A | 9/1998 | Yamamoto et al. |
| 6,120,597 | A | 9/2000 | Levy et al. |
| 7,227,429 | B2 * | 6/2007 | Kawachi et al. ............. 333/133 |
| 7,408,287 | B2 * | 8/2008 | Matsumoto et al. .......... 310/320 |
| 7,586,239 | B1 * | 9/2009 | Li et al. .................... 310/323.02 |
| 7,602,102 | B1 | 10/2009 | Barber et al. |
| 2002/0079986 | A1 | 6/2002 | Ruby et al. |
| 2003/0030118 | A1 | 2/2003 | Kim |
| 2004/0027214 | A1 | 2/2004 | Duwel et al. |
| 2004/0189423 | A1 * | 9/2004 | Loebl et al. ................... 333/187 |
| 2004/0189425 | A1 * | 9/2004 | Iwashita et al. .............. 333/193 |
| 2005/0030127 | A1 | 2/2005 | Loebel et al. |
| 2006/0290449 | A1 * | 12/2006 | Piazza et al. .................. 333/187 |
| 2007/0082632 | A1 | 4/2007 | Liu |
| 2007/0116081 | A1 | 5/2007 | Vetrovec et al. |
| 2007/0207761 | A1 * | 9/2007 | LaBerge et al. ............ 455/277.1 |
| 2007/0210879 | A1 * | 9/2007 | Cardona et al. ................ 333/188 |
| 2008/0252394 | A1 * | 10/2008 | Tajima et al. ................. 333/133 |
| 2009/0072663 | A1 | 3/2009 | Ayazi et al. |
| 2010/0052470 | A1 * | 3/2010 | Andle et al. ............. 310/313 A |

OTHER PUBLICATIONS

Desvergne, et al.: "Intermediate Frequency Lamb Wave Coupled Resonator Filters for RF Receiver Architecture"; 37th European Solid State Device Research Conference, 2007, ESSDERC, IEEE, PI, Sep. 1, 2007, pp. 358-361, XP031202732, DOI: 10.1109/ESSDERC.2007.4430952. ISBN: 978-1-4244-1123-8; Figs. 3, 4, 7 and Chapter II.

Perez, et al.: *Bandwidth Control in Acoustically Coupled A1N Contour Mode MEMS Filters*, Frequency Control Symposium, 2009 Joint with the 22nd European Frequency and Time Forum, IEEE International, IEEE, Piscataway, NJ US, Apr. 20, 2009, pp. 64-69, XP031492340, ISBN: 978-1-4244-3511-1; Figs. 1, 9, 10.

Ho, et al.: "*High-Order Composite Bulk Acoustic Resonators*", Micro Electro Mechanical Systems, 2007, MEMS. IEEE 20th International Conference on, IEEE, PI, Jan. 1, 2007, pp. 791-794, XP031203848, ISBN: 978-1-4244-0950-1; Figs. 1, 3.

Abdolvand, et al.: "*A Low-Voltage Temperature-Stable Micromechanical Piezoelectric Oscillator*", Solid-State Sensors, Actuators and Microsystems Conference, 2007, Transducers2007, International, IEEE, Piscataway, NJ, US, Jun. 10, 2007, pp. 53-56, XP031215969, ISBN: 978-1-4244-0841-2; Chapters 2, 3, Figs. 1, 2.

International Search Report for corresponding PCT/US2010/036614 completed Jul. 18, 2010.

* cited by examiner

FIG. 11

LATERAL OVER-MODED BULK ACOUSTIC RESONATORS

TECHNICAL FIELD

The present invention relates generally to communications systems, and more particularly to a lateral over-moded bulk acoustic resonator assembly.

BACKGROUND

As communications devices have grown smaller and more complex, performance demands on radio frequency (RF) components have increased significantly. Particularly, as allocated frequency bands for mobile communication devices are heavily utilized, it is desirable to utilize bands of frequency spectrum allocated to other services without interfering with the designated users. Cognitive radios will measure the spectrum usage of a band and communicate with other cognitive radios using underutilized portions of the band. A spectrum analysis capability is key to the operation of a cognitive radio. Unfortunately, providing high performance spectrum analysis at these frequencies often requires large and unwieldy components. Filtering components, in particular, are difficult to miniaturize at higher frequencies. Various resonator assemblies have been utilized to provide a filtering function on an integrated circuit scale, but these efforts have been complicated by excessive loss and impractical expense.

SUMMARY

In one aspect of the invention, a bulk acoustic resonator assembly is provided. A substrate has a cavity on a first surface, with a sheet of high Q, low acoustic loss suspended over the cavity. The sheet of low acoustic loss material is configured such that an associated fundamental frequency of the sheet of low acoustic loss material is a function of a length of the sheet of low acoustic loss material in a direction parallel to the first surface of the substrate. A transducer includes an electromechanical layer on the sheet of low acoustic loss material and a patterned conductive material formed on the electromechanical material. The transducer is configured to induce vibrations in the low acoustic loss material upon application of an electrical signal to the conductive pattern.

In another aspect of the invention, a channelizer system is provided for separating an input signal into a plurality of frequency subbands. A roofing filter is configured to limit an input signal to a frequency band of interest. A plurality of acoustic resonators each comprises a sheet of low acoustic loss material. The acoustic resonators are configured such that their corresponding sheets of low acoustic loss material are substantially coplanar. A plurality of filters each represent one of the plurality of frequency subbands and include an associated set of at least one of the plurality of acoustic resonators. An associated length of each of the set of acoustic resonators associated with a given filter is a function of its associated frequency sideband.

In yet a further aspect of the invention, a method is provided for fabricating a bulk acoustic resonator. A low acoustic loss material is bonded to a substrate. The low acoustic loss material is thinned to a desired thickness. A layer of electromechanical material is deposited on the low acoustic loss material. A metallic layer is deposited on the electromechanical material in a designated pattern, such that the metallic layer and the layer of electromechanical material form a transducer assembly. A portion of the low acoustic loss material is removed as to substantially isolate a sheet of low acoustic loss material from a remainder of the low acoustic loss material. The sheet of low acoustic loss material is released from the substrate.

DETAILED DESCRIPTION

The present invention is directed to an acoustic resonator assembly configured to provide a high quality factor and low impedance and implantable in a large-scale integration process. To this end, the resonator assembly is implemented laterally, such that the resonator structure is in a plane substantially parallel to a surface of the underlying substrate. Accordingly, the vibration of the low acoustic loss material is also lateral to the surface, allowing an associated wavelength of the low acoustic loss material to be tuned via a length of the material across the surface, as opposed to a height above the surface. This allows for acoustic resonators, having different associated resonant frequencies, to be implemented on a given substrate via lithography patterning.

Figure 1:
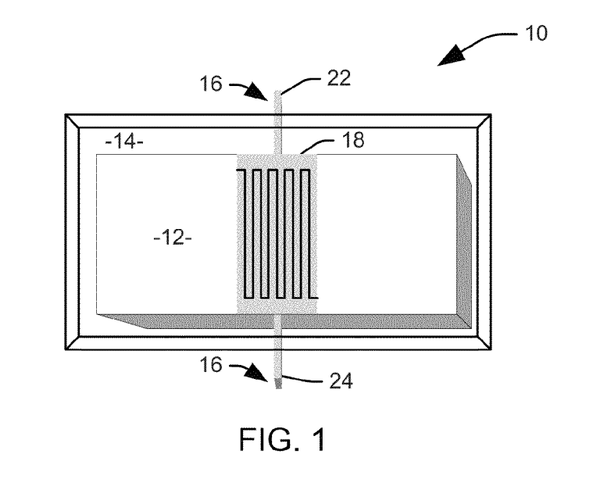
FIG. 1 illustrates a perspective view of a first exemplary implementation an acoustic resonator in accordance with an aspect of the present invention.
Figure 2:
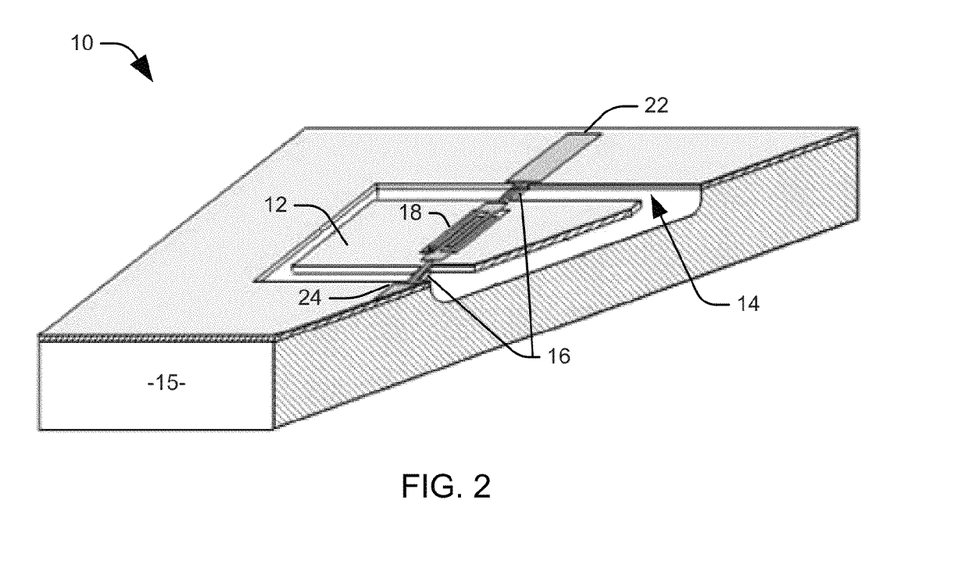
FIG. 2 illustrates a cutaway view of the acoustic resonator of FIG. 1.

FIG. 1 illustrates a perspective view of a first implementation an acoustic resonator 10 in accordance with an aspect of the present invention. FIG. 2 provides a cutaway view of the acoustic resonator, and retains the same numbering. The acoustic resonator 10 comprises a sheet of low acoustic loss material 12 suspended over a cavity 14 in an underlying substrate 15. It will be appreciated that the substrate can be any appropriate substrate for producing an integrated circuit (e.g., silicon), and the low acoustic loss material can comprise any resonant material having a high quality factor at microwave frequencies that is appropriate for use in integrated circuit applications. Further, the substrate 15 can itself comprise a low acoustic loss material, such that the sheet of low acoustic loss material 12 is simply a portion of the substrate isolated from the bulk of the substrate via the cavity 14. In one implementation, the sheet of low acoustic loss material 12 can be made from sapphire, but it will be appreciated that materials such as yttrium-aluminum-garnet (YAG), gadolinium-gallium-garnet (GGG), spinel, lithium niobate, and similar high quality factor materials can be used. The sheet of low acoustic loss material 12 can be suspended over the cavity 14 via a plurality of support anchors 16 extending from the sheet to the walls of the cavity. It will be appreciated that the sheet of low acoustic loss material 12 can be fabricated to include the support anchors 16, such that the anchors are also fabricated from the low acoustic loss material.

The acoustic resonator 10 further comprises an interdigitated transducer 18 configured to actuate the sheet of low acoustic loss material in response to an applied electric signal. The transducer 18 can be fabricated as a thin film (e.g., on the order of two hundred fifty nanometers) on the sheet of low acoustic loss material 12 from an appropriate electromechanical material and a thin conductive film deposited on the electromechanical material to form a plurality of interdigitated teeth and electrodes 22 and 24 on either side of the sheet of low acoustic loss material. It will be appreciated that the layer of conductive material can be deposited across the support anchors as to connect the transducer 18 to the electrodes 22 and 24. It will be appreciated that the number and width of the interdigitated teeth of the transducer 18 can vary with the application and a desired frequency response. In one implementation, in which the transducer 18 is configured for operation at around three gigahertz, the teeth can have a width of approximately nine-tenths of a micron, and a period of approximately eighteen-tenths of a micron. In the illustrated implementation, the electromechanical material can comprise a piezoelectric material having a high quality factor, such as aluminum nitride, or an electrostrictive material, such as barium strontium titanate. In accordance with an aspect of the present invention, a transducer formed from an electrostrictive material can be made controllable via a DC bias as to provide a switchable resonator assembly. The conductive material can be any appropriate conductive material such as gold or copper. In one implementation, nickel is used to reduce loss and maintain the high quality factor of the resonator.

In accordance with an aspect of the present invention, the sheet of low acoustic loss material 16 is configured such that a largest dimension of the sheet is aligned in a direction parallel with the substrate. The sheet of low acoustic loss material 16 is configured to vibrate along a direction parallel with the substrate, such that the length along the longest dimension defines a fundamental frequency of the resonator. Since the resonator is implemented to vibrate laterally, the vibration can be made to consist primarily of Lamb waves, that is, a combination of longitudinal and shear waves. To this end, a thickness of the sheet of low acoustic loss material 12 can be selected to promote the formation of these waves. In an exemplary implementation, the sheet of low acoustic loss material 12 can have a thickness of approximately one micron. It will be appreciated, however, that, depending on the application thicknesses between one-half of a micron and ten microns may be used. Further, in accordance with an aspect of the present invention, an associated length of the sheet of low acoustic loss material 12 can be selected as to tune the acoustic resonator to a particular fundamental frequency. To this end, a longest dimension of the sheet of low acoustic loss material 12 can be selected to have an associated length, L, as to provide a passband with a center frequency, f, such that:

$$L = \frac{N \cdot v_{ac}}{2f} \qquad \text{Eq. 1}$$

where $v_{ac}$ is the velocity of sound in the low acoustic loss material and N is an associated mode of the resonator.

It will be appreciated that the illustrated resonator 10 is ideally suited for large scale integration. Specifically, the resonator center frequency and bandwidth are set by the in-plane, lateral dimensions of the acoustic sheet 12, which permits the co-fabrication of multiple resonators having varying properties on the same chip. The illustrated resonator 10 further reduces energy dissipation mechanisms such as anchor and material losses to achieve a higher quality factor and a correspondingly narrower bandwidth, providing a quality factor for the resonator in excess of ten thousand.

Figure 3:
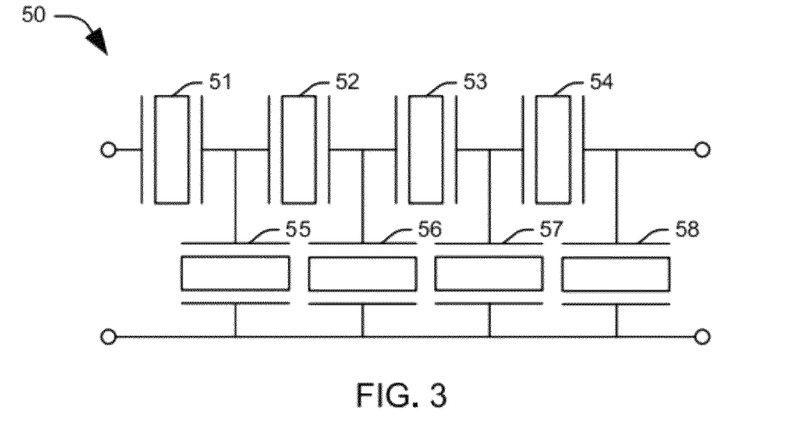
FIG. 3 illustrates a functional diagram of an exemplary ladder filter constructed from a plurality of lateral over-moded bulk acoustic resonators in accordance with an aspect of the present invention

FIG. 3 illustrates a functional diagram of an exemplary ladder filter 50 constructed from a plurality of lateral over-moded bulk acoustic resonators (LO-BARs) 51-58 in accordance with an aspect of the present invention. In the illustrated implementation, the ladder filter 50 comprises a first plurality of LO-BARs 51-54 arranged in series and a second plurality of LO-BARs 55-58 arranged in parallel and providing a shunt to ground after each of the first plurality of LO-BARs. It will be appreciated that the other configurations of the filter 50 are also possible in accordance with an aspect of the present invention, such that the filter can be implemented in electrically self-coupled (e.g., via intrinsic device capacitance), mechanically coupled (e.g., via vibrating quarter-wave elements), or hybrid configurations. Further, depending on the desired implementation, the series LO-BARs 51-54 can be replaced with a series of capacitors or other resonators.

Figure 4:
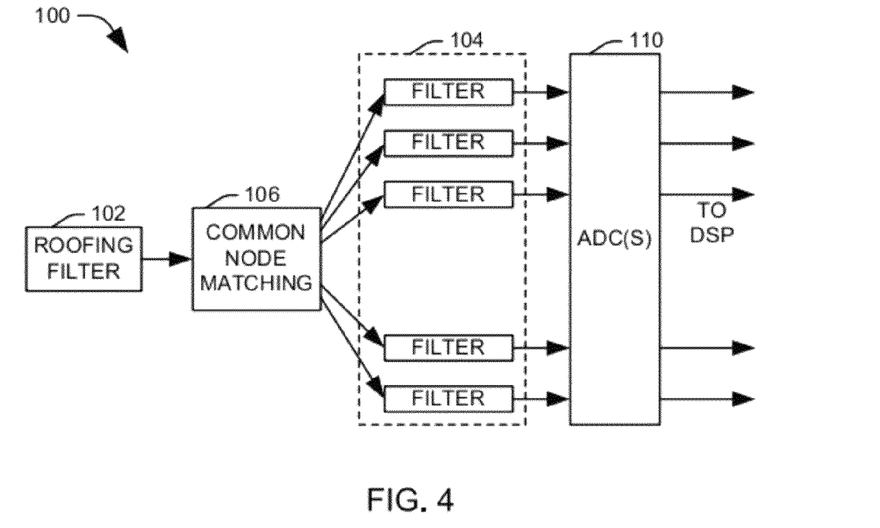
FIG. 4 illustrates a functional block diagram of a first implementation of a channelizer system in accordance with an aspect of the present invention.

FIG. 4 illustrates a first implementation of a channelizer system 100 designed to be implemented on a single integrated circuit chip in accordance with an aspect of the present invention. The illustrated channelizer system 100 relies on two filtering stages, a roofing filter 102 configured to limit an input signal to a relatively large frequency band of interest, and a plurality of filters 104 implemented with lateral over-moded bulk acoustic resonators (LO-BARs) configured to provide a high quality factor and correspondingly narrow passbands. Essentially, the roofing filter 102 is configured to select among the various passbands produced by the resonance of each acoustic resonator. In the illustrated implementation, the channelizer system 100 can be configured to operate at microwave frequencies around three gigahertz. Accordingly, the roofing filter 104 can be configured to have a low loss passband with a one decibel bandwidth of around five megahertz and a stop-band for frequencies greater that 3.011 gigahertz and less that 2.089 gigahertz. In this implementation, the stop-band attenuation will be at least twenty to thirty decibels. In one implementation, the roofing filter will have a quality factor between about five thousand and about ten thousand to avoid unnecessary signal loss.

The filtered input signal is then distributed to the plurality of filters 104 at a common node matching component 106. The common node matching component 106 can comprise any appropriate components for conditioning the filtered input signal for distribution along the plurality of filters 104. In the illustrated implementation, the channelizer 100 divides the signal into one-hundred channels, such that the common node matching component 106 distributes the signal to each of one-hundred individual filters. In one implementation, the common node matching component exploits the fact that the input impedance to the LO-BAR filters appears capacitive, except in the passband, and multiplexes the filters through use of an inductor to cancel the node capacitance. It will be appreciated that the impedance of the roofing filter 102 and each of the plurality of LO-BAR filters 104 must be selected to facilitate this matching, but it has been determined that, in a channelizer design in accordance with an aspect of the present invention, the design parameters, specifically, frequency and impedance, of the filters 102 and 104 are decoupled, allowing for appropriate selection of the impedance of the filters.

Each of the plurality of filters 104 is implemented as one or more lateral over-moded bulk acoustic resonators. It will be appreciated that, to provide a desired resolution, a given filter can comprise multiple LO-BARs, and, in one implementation, a fourth-order filter comprising eight resonators can be used. As discussed previously, the resonators can be generated as part of a large scale integration process, allowing for the implementation of a large number (e.g. significantly more than one hundred) of filters, each containing multiple resonators. Each of the plurality of filters is configured to operate with a different passband, such that the output of the plurality of filters 104 is a plurality of channels representing distinct frequency bands. In one implementation, one hundred filters are used to provide one hundred distinct channels from the input signal. It will be appreciated that the LO-BAR design places the resonant layer of each resonator in a single plane, such that resonators of varying frequencies can be fabricated in a single lithography process.

In the illustrated implementation, the plurality of filters 104 is configured to operate on a two-hundred tenth overtone at frequencies around three gigahertz. The illustrated implementation uses a sapphire acoustic layer in the resonators forming each filter, such that each resonator has a comb frequency spacing of approximately fourteen megahertz, with each resonant mode providing a bandwidth of approximately thirty kilohertz. Accordingly, the plurality of filters 104 provide a plurality of thirty kilohertz channels, which can be converted to digital signals at a respective analog-to-digital converters (ADCs) 110 and provided to a digital signal processor (DSP) or similar component for processing.

Figure 5:
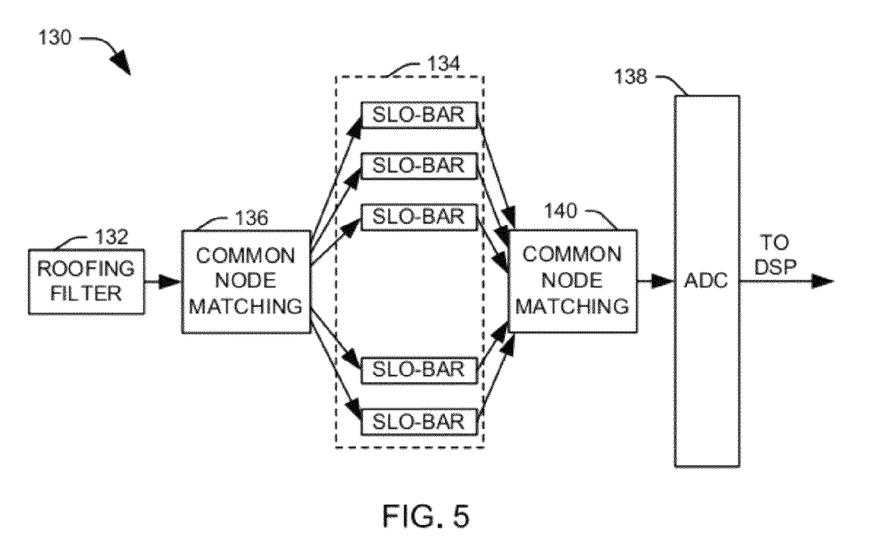
FIG. 5 illustrates a functional block diagram of a second implementation of a channelizer system in accordance with an aspect of the present invention.

FIG. 5 illustrates a second exemplary implementation of a channelizer system 130 designed to be implemented on a single integrated circuit chip in accordance with an aspect of the present invention. The illustrated channelizer system 130 relies on two filtering stages, a roofing filter 132 configured to limit an input signal to a relatively large frequency band of interest, and a plurality of selectable filters 134 implemented with switchable lateral over-moded bulk acoustic resonators (SLO-BARs) comprising electrostrictive transducers. Through the use of electrostrictive transducers, each of the resonators can be controlled via a DC bias, such that the activity of the plurality of selectable filters 134 can be regulated at the filter.

During operation, the input signal is filtered at the roofing filter 132 and provided to one or more of the plurality of filters 134 through a common node matching component 136. The common node matching component 136 can comprise any appropriate components for conditioning the filtered input signal for distribution along the plurality of filters 134. Each of the plurality of filters 134 is implemented as one or more selectable lateral over-moded bulk acoustic resonators, and a desired filter can be activated or deactivated by applying or removing a direct current bias to the resonators comprising the filter. Accordingly, the filters can be activated in sequence to provide representative samples at each channel to an associated analog-to-digital converter (ADC) 138 through another common node matching component 140. Accordingly, the activity across the various spectral bands represented by the plurality of filters 134 can be monitored through the use of a single ADC, allowing for a significant reduction in the chip space and power necessary to implement the channelizer system.

Figure 6:
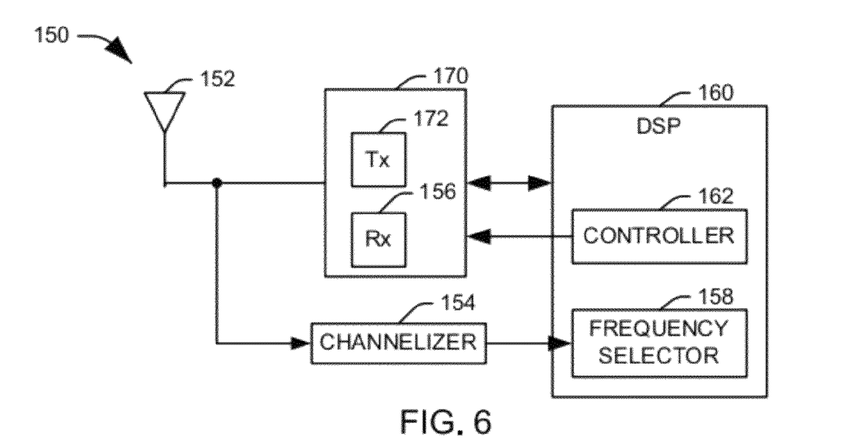
FIG. 6 illustrates a functional block diagram of an exemplary cognitive radio system in accordance with an embodiment of the present invention.

FIG. 6 illustrates a functional block diagram of an exemplary cognitive radio system 150 in accordance with an embodiment of the present invention. An antenna 152 is configured to transmit and receive radio frequency (RF) input signals in a desired frequency range. In the illustrated implementation, the cognitive radio system 150 is designed to operate at microwave frequencies, for example, in a band around three gigahertz, and the antenna is configured to be responsive to signal in and around these frequencies. Signals received by the antenna 152 are provided to each of a channelizer 154, implemented with lateral over-moded acoustic resonators in accordance with an aspect of the present invention, and a receiver assembly 156 configured to extract information modulated onto the signal at a frequency of interest. For example, the channelizer 154 can comprise one of the channelizers illustrated in FIGS. 4 and 5, and provide a plurality of channels, each represented as a digital signal and representing a narrow frequency band of the input signal.

The plurality of channels provided from the channelizer can be provided to a frequency selector 158 component of a digital signal processor (DSP) 160. It will be appreciated that the frequency selector can be implemented in hardware, software, or a combination thereof. The frequency selector 158 is configured to analyze the data provided from the plurality of channels to determine which portions of the spectrum are underutilized and thus appropriate for use. The frequency selector 158 can include information regarding known signal types, modulation schemes, and associated frequencies, as well as various preset power thresholds for determining whether a particular spectral band is suitable for use.

The determination of the frequency selector 158 is provided to a controller 162 configured to direct a radio front end 170 comprising each of the receiver assembly 156 and a transmitter assembly 172 to operate at one of the approved frequencies. In some implementations, configuration information, including the selected frequency or frequencies, can be provided to one or more other entities in an associated network. Accordingly, the cognitive radio system 150 can adapt to changing broadcast environments to optimize utilization of free or underutilized portions of the frequency spectrum.

Figure 7:
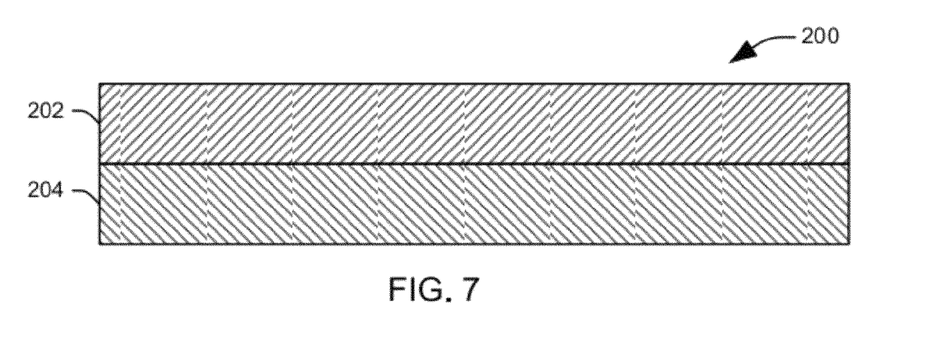
FIG. 7 illustrates a schematic cross-sectional view of a lateral over-moded bulk acoustic resonator in accordance with an aspect of the present invention in an early stage of fabrication.

Turning now to FIGS. 7-11, fabrication of a lateral over-moded bulk acoustic resonator in accordance with an aspect of the present invention is discussed. It will be appreciated that these drawings are not to scale, and that certain features of the resonator may be exaggerated or omitted to facilitate illustration of the fabrication process. It is to be further appreciated that the present example is exemplary, and that any of a number of fabrication methods can be utilized to provide a lateral over-moded bulk acoustic resonator in accordance with an aspect of the present invention. FIG. 7 illustrates a resonator structure 200 in its early stages of fabrication. At this stage, a wafer of low acoustic loss material 202 is bonded to an underlying substrate 204. This can be accomplished via any appropriate bonding process. In the illustrated example, the low acoustic loss material 202 is a high quality sapphire wafer that is bonded to a silicon carrier wafer that serves as the substrate 204. It will be appreciated that the low acoustic loss material 202 can be selected to provide a large quality factor, such that an associated bandwidth of the lateral over-moded bulk acoustic resonator can be minimized.

Figure 8:
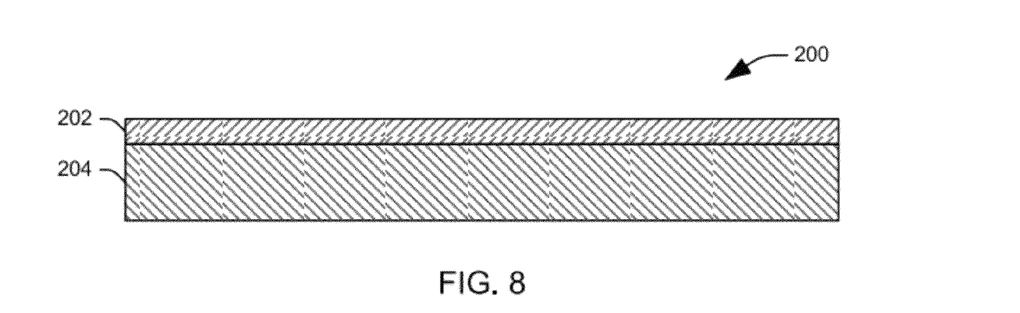
FIG. 8 illustrates a schematic cross-sectional view of the structure of FIG. 7 after a thinning of the low acoustic loss material in accordance with an aspect of the present invention.

Next, as represented in FIG. 8, the low acoustic loss material 202 is thinned to a desired thickness, selected to provide desired resonant properties of the. For example, the desired thickness can be between one-half and one and one-half microns. In one implementation, the low acoustic loss material 202 is thinned via grinding and polishing of the exposed surface of the low acoustic loss material 202. Alternatively, a portion of the low acoustic loss material 202 can be weakened via an ion implantation process and an anneal can be applied to the low acoustic loss material. The strain caused by the annealing process induces a split in the low acoustic loss material 202 at the weakened portion, removing the undesired portion of the material. Regardless of the thinning method used, a chemical mechanical polish can be applied to the exposed surface of the low acoustic loss material 202 to produce the damage free surface needed for maximum quality factor.

Figure 9:
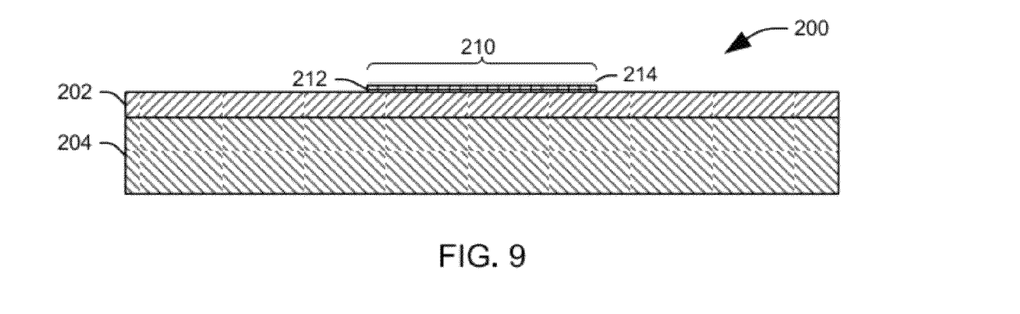
FIG. 9 illustrates a schematic cross-sectional view of the structure of FIG. 8 after the fabrication of a transducer assembly on the low acoustic loss material in accordance with an aspect of the present invention.

FIG. 9 illustrates the fabrication of an interdigitated transducer 210 on the surface of the low acoustic loss material. A layer of electromechanical material 212 is deposited on the surface of the low acoustic loss material 202. For example, the electromechanical material 212 can include a piezoelectric material such as aluminum nitride or an electrostrictive material such as barium strontium titanate. In one implementation, the electromechanical material 212 can be deposited on the surface of the low acoustic loss material 202 by reactive sputtering. It will be appreciated that an associated thickness of electromechanical material 212 can be selected according to thickness of the low acoustic loss material 202 as to provide a high electromechanical coupling between the materials without significantly reducing the resonator Q factor. Photolithography and inductively coupled plasma etching can be used to ensure that the electromechanical material 212 is confined to those areas necessary for transduction.

A conductive layer 214 can be deposited on the electromechanical layer 212 and etched to form an interdigitated pattern with a metal etchant. In the interdigitated pattern each finger is approximately one quarter of an acoustic wavelength wide and is spaced from its neighbor by the same distance to provide the interdigitated transducer 210. The conductive layer 214 can be extended from the electromechanical layer 212 in one or more directions to allow for the electrical connection of the resonator to other components on an integrated circuit chip. It will be appreciated that the conductive layer can comprise any metallic coating appropriate for a deposition process, such as gold or nickel. In an exemplary implementation, a layer of nickel is used to reduce mechanical losses and maintain the quality factor of the resonator. In the illustrated implementation, the conductive layer 214 is deposited and patterned employing photolithography.

Figure 10:
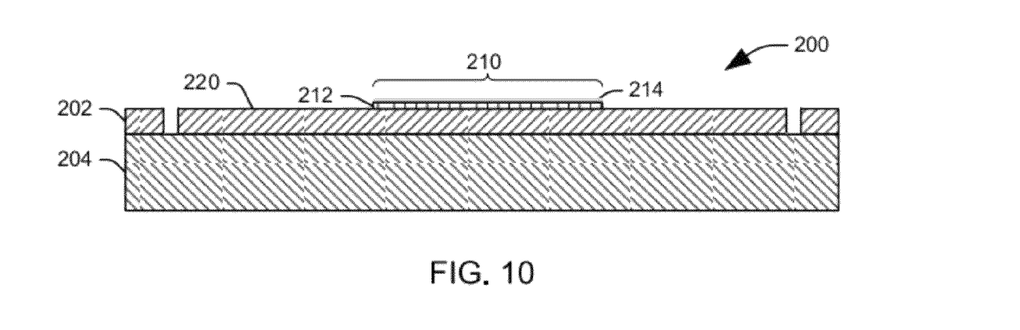
FIG. 10 illustrates a schematic cross-sectional view of the structure of FIG. 9 after the substantially isolation of a sheet of low acoustic loss material from the layer of low acoustic loss material in accordance with an aspect of the present invention.

As illustrated in FIG. 10, low acoustic loss material surrounding the resonator is removed as to substantially isolate a sheet of low acoustic loss material 220 from the layer of low acoustic loss material 202. It will be appreciated that by "substantially isolate," it is intended to convey that most but not all of the low acoustic loss material in a loop surrounding the resonator is removed, and that the sheet of low acoustic loss material 220 remains coupled to the layer of low acoustic loss material 202 via one or more micromachined tethers (not shown) formed as interruptions in the loop of removed material. In the illustrated implementation, the low acoustic loss material is removed by a combination of photomasking and an appropriate etching process, such as reactive ion etching or inductively coupled plasma etching. It will be appreciated that the photomasking and etching process used to form the sheet of low acoustic loss material 220 is amendable to large scale integration and can produce sheets of different lengths, such that a plurality of resonators having different fundamental frequencies can be formed on a substrate in a single fabrication process.

Figure 11:
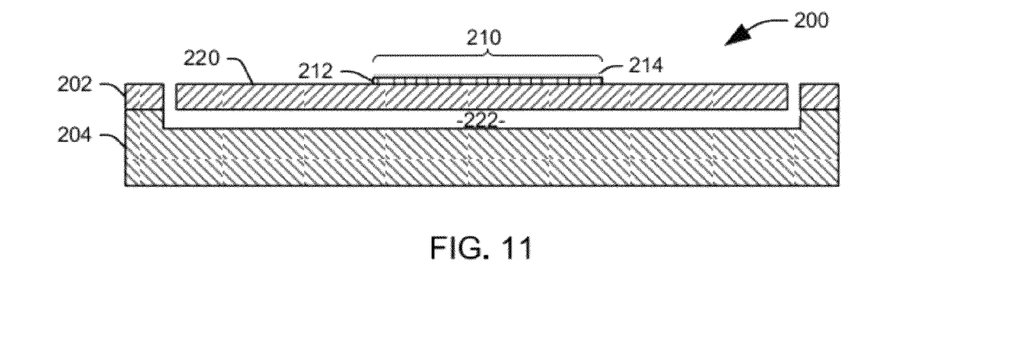
FIG. 11 illustrates a schematic cross-sectional view of the structure of FIG. 10 after the release of the sheet of low acoustic loss material from the underlying substrate in accordance with an aspect of the present invention.

FIG. 11 illustrates the resonator after the sheet of low acoustic loss material 220 has been released from the underlying substrate 204. For example, the release can be performed by exposing the resonator to a selective etch to form a cavity 222. For example, where a silicon substrate is used, xenon difluoride or another silicon etch can be used. After the release of the sheet of low acoustic loss material 220 is complete, the sheet and its interdigitated transducer 210 is suspended over the cavity 222 by micromachined anchors (not shown) attached to the remaining low acoustic loss material 202.

In an alternative implementation, a lateral over-moded bulk acoustic resonator in accordance with an aspect of the present invention can be fabricated via a crystal ion slicing process. For example, a layer of an oxide mask (e.g., silicon oxide) can be applied to a wafer of yttrium-aluminum-garnet (YAG), and a hole in the oxide mask can be created via a photolithography process. A region of the YAG can be weakened via ion implantation at the hole in the oxide layer, and the YAG wafer can be dry etched to open holes to the damaged region. The YAG wafer is annealed in forming gas to disrupt the damaged material and create a cavity underneath a thin membrane of YAG. The oxide layer can then be remove, for example, via a phosphoric acid etch, and the wafer can be further annealed to relieve any damage in the YAG wafer.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A bulk acoustic resonator assembly comprising:
   a substrate, having a first surface, the first surface having a cavity;
   a sheet of low acoustic loss material configured such that an associated fundamental frequency of the sheet of low acoustic loss material is a function of a length of the sheet of low acoustic loss material in a direction parallel to the first surface of the substrate, the sheet of low acoustic loss material being suspended over the cavity; and
   a transducer, comprising an electromechanical material formed on and in contact with a given surface of the sheet of low acoustic loss material opposite the cavity and a patterned conductive material formed on the electromechanical material, the transducer being configured to induce vibrations in the low acoustic loss material upon application of an electrical signal to the conductive pattern, wherein the low acoustic loss material comprises one of yttrium-aluminum-garnet, Gadolinium-Gallium-Garnet (GGG), and Spinel.

2. The bulk acoustic resonator assembly of claim 1, the electromechanical material comprising an electrostrictive material, the operation of the transducer being controllable via application of a direct current bias.

3. The bulk acoustic resonator assembly of claim 2, the electrostrictive material comprising barium strontium titanate.

4. The bulk acoustic resonator assembly of claim 1, the sheet of low acoustic loss material being fabricated from the substrate, such that the substrate and the sheet of low acoustic loss material are comprised of the same material.

5. The bulk acoustic resonator assembly of claim 4, the sheet of low acoustic loss material being fabricated via a crystal ion slicing process.

6. The bulk acoustic resonator assembly of claim 1, the electromechanical material comprising a piezoelectric material.

7. The bulk acoustic resonator assembly of claim 1, the patterned conductive material being an interdigitated pattern.

8. The bulk acoustic resonator assembly of claim 1, the conductive material comprising nickel.

9. A ladder filter comprising:
    a first set of elements, being one of electrically and mechanically coupled and arranged in series; and
    a second set of elements, each being one of electrically and mechanically coupled to a corresponding one of the first set of elements in a shunt arrangement, each of the second set of elements comprising the bulk acoustic resonator assembly of claim 1.

10. The bulk acoustic resonator assembly of claim 1, each of the sheet of low acoustic loss material and the transducer being configured such that an associated quality factor of the bulk acoustic resonator assembly is greater than ten thousand.

11. The bulk acoustic resonator assembly of claim 1, the sheet of low acoustic loss material being configured such that the vibrations induced by the transducer primarily comprise Lamb waves.

12. The bulk acoustic resonator assembly of claim 1, the sheet of low acoustic loss material comprising a plurality of micromachined tethers that maintain the suspension of the sheet of low acoustic loss material over the cavity.

13. A channelizer system configured to separate an input signal into a plurality of frequency subbands comprising:
    a roofing filter configured to limit an input signal to a frequency band of interest;
    a plurality of filters, each filter representing one of the plurality of frequency subbands and comprising a bulk acoustic resonator assembly as recited in claim 1, the associated length of the sheet of low acoustic loss material of the bulk acoustic resonator assembly associated with a given filter being selected to provide responsiveness to the frequency subband associated with the filter.

14. A channelizer system configured to separate an input signal into a plurality of frequency subbands to comprising:
    a roofing filter configured to limit an input signal to a frequency band of interest;
    a plurality of acoustic resonators, each comprising a sheet of low acoustic loss material and a transducer comprising an electromechanical material disposed on and in contact with a given surface of the sheet, the plurality of acoustic resonators being configured such that their corresponding sheets of low acoustic loss material are substantially coplanar, wherein the low acoustic loss material comprises one of yttrium-aluminum-garnet, Gadolinium-Gallium-Garnet (GGG), and Spinel; and
    a plurality of filters, each filter representing one of the plurality of frequency subbands and comprising an associated set of at least one of the plurality of acoustic resonators, an associated length of each of the set of acoustic resonators associated with a given filter being a function of its associated frequency sideband.

15. A cognitive radio system comprising the channelizer system of claim 14.

* * * * *